United States Patent [19]
Jennings

[11] Patent Number: 6,037,239
[45] Date of Patent: Mar. 14, 2000

[54] METHOD FOR MAKING A CONTACT STRUCTURE FOR A POLYSILICON FILLED TRENCH ISOLATION

[75] Inventor: Dean Jennings, San Ramon, Calif.

[73] Assignee: Elantec, Inc., Milpitas, Calif.

[21] Appl. No.: 08/841,494

[22] Filed: Apr. 23, 1997

[51] Int. Cl.[7] .................................................. H01L 21/302
[52] U.S. Cl. ......................... 438/430; 438/270; 438/424
[58] Field of Search ..................................... 438/270, 339, 438/684, 685, 424, 406

[56] References Cited

U.S. PATENT DOCUMENTS

| | | | |
|---|---|---|---|
| 4,638,552 | 1/1987 | Shimbo et al. | 438/455 |
| 4,968,628 | 11/1990 | Delgado et al. | 438/406 |
| 5,116,779 | 5/1992 | Iguchi | 438/424 |
| 5,459,101 | 10/1995 | Fujii et al. | 438/684 |
| 5,480,837 | 1/1996 | Liaw et al. | 438/684 |
| 5,684,319 | 11/1997 | Hebert | 257/336 |
| 5,712,185 | 1/1998 | Tsai et al. | 438/424 |

OTHER PUBLICATIONS

Stanley Wolf Silicon Processing For The VLSI Era vol. I Lattice Press p. 167, 1986.

*Primary Examiner*—Charles Bowers
*Assistant Examiner*—David S Blum
*Attorney, Agent, or Firm*—Fliesler, Dubb, Meyer & Lovejoy LLP

[57] ABSTRACT

A method for dissipating accumulated charge in a trench isolation structure, comprising the steps of: forming a contact region of an area having a cross section greater than the width of the isolation structure; and coupling the isolation structure to a charge dissipation means.

27 Claims, 4 Drawing Sheets

METHOD FOR MAKING A CONTACT STRUCTURE FOR A POLYSILICON FILLED TRENCH ISOLATION

BACKGROUND OF THE INVENTION

1. Field of the Invention

The invention relates to insulation structures, and particularly to improving the characteristics of trench isolation structures in which polysilicon is used as a trench fill material.

2. Description of the Related Art

A typical integrated circuit, manufactured on a silicon substrate, comprises a series of active devices formed in and on the silicon substrate. Each active device is formed by introducing impurities into a surface of the substrate, generally through the use of implantation or diffusion of the impurity, to vary the conductivity of different regions of the substrate. This requires a series of processing steps which include masking selected portions of the wafer to place the impurities at selected locations on the wafer. A substrate will generally have a first conductivity type, with the impurities selected to form regions in the substrate of opposite conductivity type or to enhance conductivity of the substrate. The active devices are electrically isolated from other active devices through the use of various electrical isolation schemes.

In forming some types of integrated circuits, particularly bipolar devices, it is desirable to provide layers of impurity which are "buried" below the surface of the substrate. Traditionally, a buried layer was formed in a substrate prior to the deposition of epitaxial silicon on the surface of a single crystal substrate, with the active devices subsequently formed in the polysilicon.

While several processing techniques are conventionally available to achieve such buried regions, advances in wafer processing technology have increased the popularity of so-called "bonded" wafers.

In bonded wafer technology, two single-crystal substrates are joined so that impurities can be introduced into a first surface of a first wafer to form an impurity region which subsequently becomes a buried region when the first wafer is bonded to a second or "handle" wafer at the first surface. In general, the handle wafer is comprised of a semiconductor having a first conductivity type, such as a p-type impurity, while the first substrate is comprised of a second conductivity type, such as an n-type impurity.

The handle wafer is "bonded" to the first substrate through any number of techniques. Bonding may occur through Van der Waals forces (where polishing tolerances are exacting, as disclosed in U.S. Pat. No. 4,638,552) or through the use of a thin oxide layer between the surfaces (such as in U.S. Pat. No. 4,968,628). After formation of the oxide, the substrates are heated to ensure bonding of the substrates to each other. This latter process is illustrated in FIGS. 1–4.

FIGS. 1–4 are cross sections generally showing the procedure for manufacturing an active device having a buried layer using a bonded wafer technique and junction isolation. Each of the active devices in an integrated circuit must be electrically isolated from the adjoining active region to prevent cross-over electrical effects between adjoining devices which would defeat overall operation of the circuit. The devices are thereafter connected to a series of metal or metal-alloy interconnect structures to complete the integrated circuit device.

FIG. 1 shows a p-type silicon substrate 10. Substrate 10 will have formed therein, for example, a p+ type region 12 by implantation or diffusion. Region 12 will become a buried layer formed in substrate 10 by selected diffusion. The surface of substrate 10 must be polished to a high tolerance surface thickness, such as by chemical mechanical polishing, and may have a thin oxide layer formed thereon such as shown in FIG. 2. Oxide layer 14 is formed on the surface of substrate 10.

As shown in FIG. 3, a handle wafer 15 is thereafter bonded to substrate 10. Handle wafer 15 is generally an n-type substrate and will also have a thin layer of oxide formed on the surface to be bonded, such surface also being polished to a high degree of smoothness. The oxide on the handle wafer will contact oxide layer 14 on the surface of substrate 10. The wafers may then be heated to a temperature of about 1,000° C. and held there for a period of time of about one hour. This causes the oxide layers to bond, thereby joining wafers 10 and 15. The resulting combined oxide layers 14' define the desired dielectric isolation thickness. Further processing can then occur on the backside 16 of substrate 10. Note that n+ region 12 becomes a buried region within the completed assembly.

As shown in FIG. 4, an n well 19 will be formed in substrate 10, and p+ emitter and collector contacts 17,18, and n+ base contact 20 may be formed to complete a bipolar transistor.

While additional n+ regions 11 may be provided to serve as reverse biased PN junction lateral device isolation, the degree of isolation afforded by junction isolation is limited by collector-substrate leakage currents and collector-substrate capacitance. Several alternative isolation techniques have developed to prevent leakage currents from impeding device performance, including dielectric isolation and trench isolation. Dielectric isolation typically comprises etching pockets in a wafer surface, oxidizing the pockets, and backfilling the pockets with polysilicon. The wafer may then be turned over, ground and polished until the original oxide layer is reached, leaving oxide isolated pockets of the original silicon material in which active devices may be formed.

Trench isolation involves etching a trench into the substrate, and filling the trench with an insulation material. Trench isolation is relatively complex because an anisotropic etch must be used to define the trench, the trench must be etched deeply into the silicon, and filling the trench with the isolation material can give rise to additional processing issues in preparing the integrated circuit. After the trench is formed in the substrate wafer, a layer of insulating material such as silicon dioxide is deposited over the surface of the wafer into the trench by a conformal deposition process, such as TEOS oxide. While silicon dioxide can fill the trench completely, this creates a great deal of stress in the substrate. Thus, the conformal layer of TEOS oxide will generally be deposited in a quantity sufficient to provide the requisite isolation, but not completely fill the trench. The remaining portion of the trench will be filled with polysilicon which has nearly identical characteristics to bulk silicon, thus reducing stress in the substrate.

This process is illustrated in FIGS. 5–7. FIG. 5 shows a cross section of a bonded wafer structure. As shown in FIG. 5, a trench 29 is anisotropically etched into the substrate 10. The etch is made using a directional etch process, such as planar plasma etching, ion beam etching or reactive ion etching, with an oxide mask layer (not shown) which is patterned to expose the trench region to be etched. The silicon substrate 10 in the trench region is etched down to oxide layer 14'. Thereafter, a TEOS oxide 34 is deposited on the second surface 13$_2$ of substrate 10. As shown in FIG. 6, the TEOS oxide 34 covers surface 13 and the sidewalls 21, 22 of trench 29. The TEOS oxide is a conformal deposition process and results in a relatively uniform oxide thickness in the range of 2–4 K Å on the bottom and sidewalls of trench 29. The remaining volume of trench 29 is filled with polysilicon 35 and the portion of oxide 34 on the surface 13$_2$ of substrate 10 is thereafter removed. As shown in FIG. 7, polysilicon 35 is thus electrically isolated from the remaining portions of silicon substrate 10.

Oxide layer 34 will be deposited to a thickness which is sufficient to provide the requisite isolation which is required based upon the particular active devices being formed. Polysilicon 35 is deposited in a trench as the preferred means of filling the remaining void, since polysilicon is thermally matched to the silicon comprising substrate 10. Thus, less stress will occur in the wafer with polysilicon in the trench during subsequent processing than were oxide used as the sole trench fill material. As a result of its electrical isolation, polysilicon 35 can act as a charge capacitor and, in certain circumstances, an inversion region 41 is induced in the silicon adjacent to oxide 34 and between two separate p+ diffused regions 27,28, as shown in FIG. 8. Diffused p+ regions 27,28 may comprise, for example, the emitter and collector of a PNP bipolar transistor. The inversion region 41 in the device silicon forms a conductive path between regions 27,28, essentially shorting the circuit.

Thus, the integrity of the active device in a given active region can be compromised.

One method previously used to cure this problem was to provide polysilicon "tabs" which allow coupling of the polysilicon to a charge dissipation mechanism. Provision of such tabs requires a separate masking and polysilicon deposition step to ensure the contacts are large enough to enclose a normal-sized contact.

SUMMARY OF THE INVENTION

The invention comprises a method and means for removing the charge from the isolating regions of a semiconductor device by providing a contact structure which couples the polysilicon or other charge retaining material in an isolation region to a charge dissipation means.

In one aspect, the method is useful in a silicon-on-insulator integrated circuit having a plurality of active devices formed therein with a trench isolation structure comprised of an insulating material and polysilicon to laterally isolate the active devices. The method comprises the steps of: forming a contact region of an area having a cross section greater than the width of the isolation structure; and coupling the isolation structure to a charge dissipation means.

In a further aspect, the method comprises: forming a trench in a silicon substrate, the silicon having a surface and the trench extending to a depth below the surface, the trench having a width; forming an insulator layer in the trench; forming a layer of polysilicon on the insulator layer in the trench; forming an oxide layer over the surface of the silicon, the oxide and the polysilicon; removing a portion of the oxide layer, said portion overlying a portion of the polysilicon and having an area with a cross-section greater than the width of the trench; and forming a conductive material on the surface of a portion of the oxide layer and on the surface of the polysilicon.

In yet another unique aspect, the invention comprises an apparatus, comprising: a first substrate having a top surface and a bottom surface; a second substrate bonded to the bottom surface of the first substrate; a trench, having a trench width, in the first substrate; an isolation layer in the trench; a semiconductor layer over the isolation layer in the trench; an oxide layer overlying the semiconductor layer, a portion of the isolation layer, and the top surface of the first substrate; and a contact area, formed in the oxide layer, the contact area having an x dimension and a y dimension being greater than the width of the trench.

BRIEF DESCRIPTION OF THE DRAWINGS

The invention will be described with respect to the particular embodiments thereof. Other objects, features, and advantages of the invention will become apparent with reference to the specification and drawings in which.

DESCRIPTION OF THE PREFERRED EMBODIMENTS

The invention provides an improved insulation structure by providing an electrical contact to the isolation structure, allowing control of the conductive nature of the isolation structure. In one embodiment, the isolation structure may comprise a trench isolation structure, with the contact being made through an oxide layer. In a unique aspect of the invention, the contact area is significantly larger than the normal minimum device fabrication dimension utilized in manufacturing of the integrated circuit device.

In the following description, numerous details, for example, specific materials, process steps, etc., are set forth in order to provide a thorough understanding of the present invention. It will be obvious, however, to one skilled in the art that the specific details need not be employed to practice the present invention. Moreover, specific details of particular processes or structures may not be specifically presented in order not to unduly obscure the invention where such details would be readily apparent to one of average skill in the art.

Figure 1:
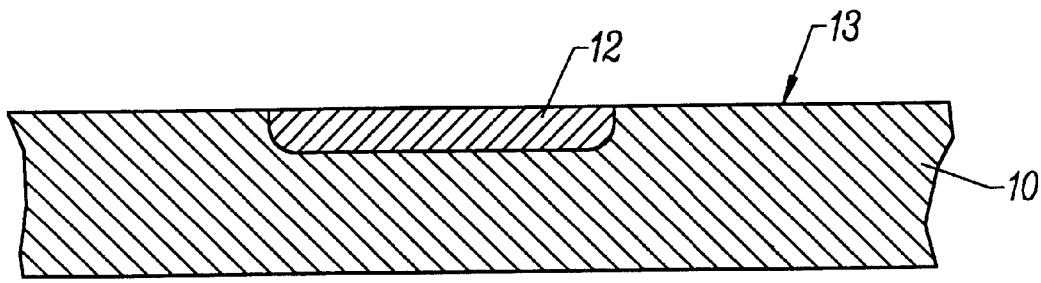
FIGS. 1–4 are cross sections of a silicon wafer illustrating the process for forming a bonded wafer integrated circuit assembly.
Figure 2:
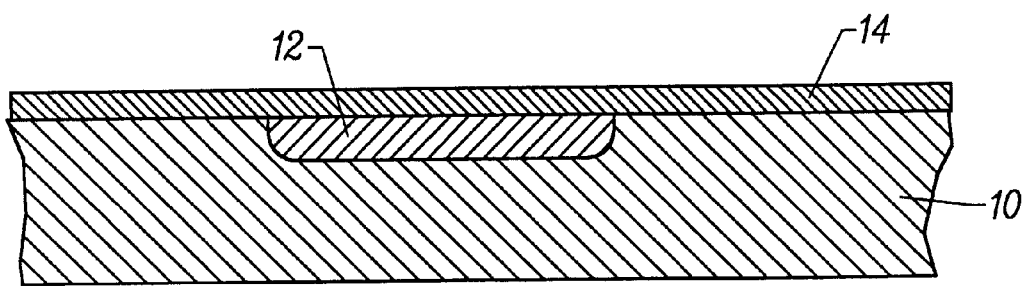
Figure 3:
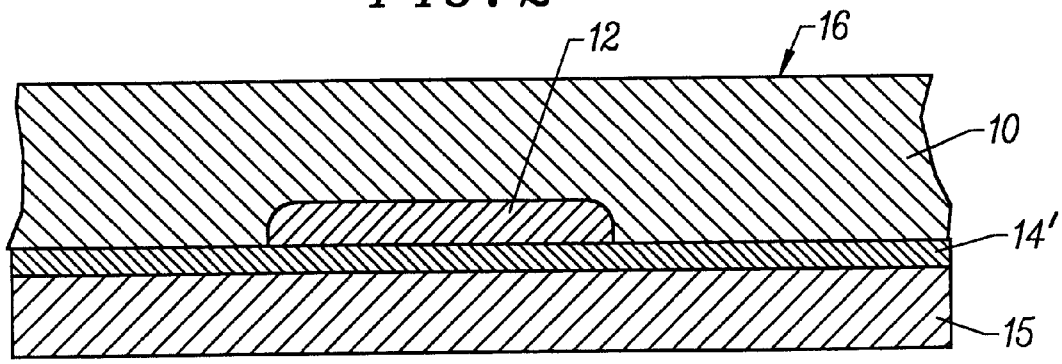
Figure 4:
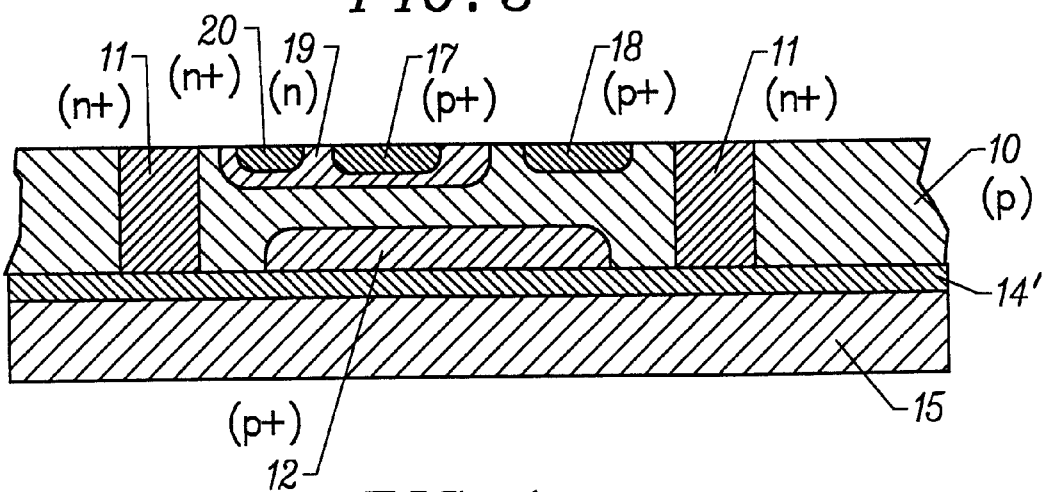
Figure 8:
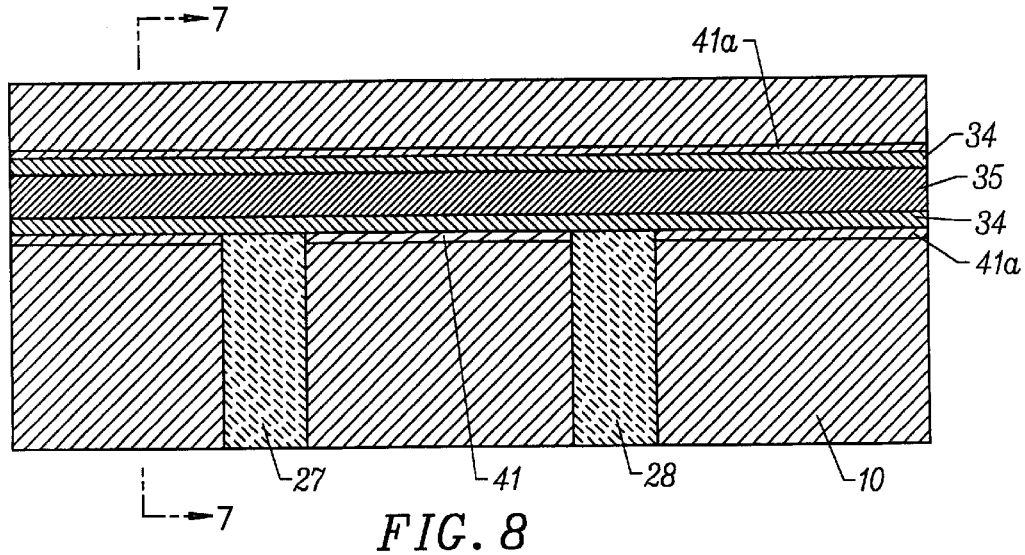
FIG. 8 is a top view of a first portion of a silicon wafer having a trench isolation structure and active regions formed therein.
Figure 5:
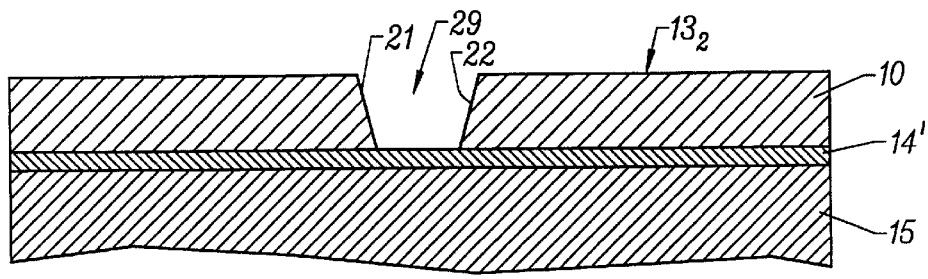
FIGS. 5–7 are cross sections of a bonded wafer illustrating formation of a trench isolation region in the bonded wafer assembly.
Figure 7:
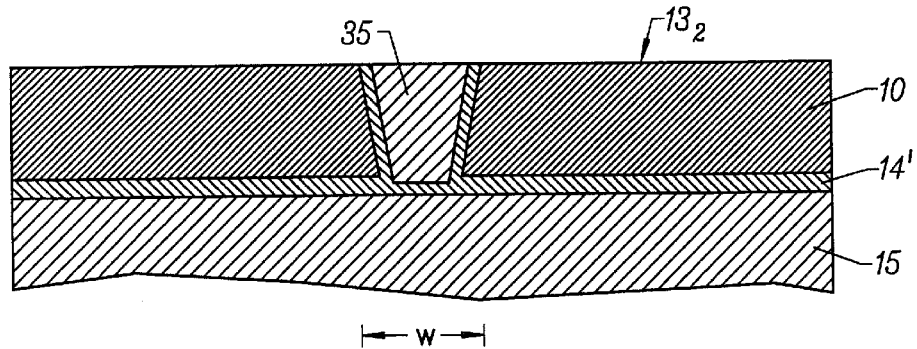
Figure 9:
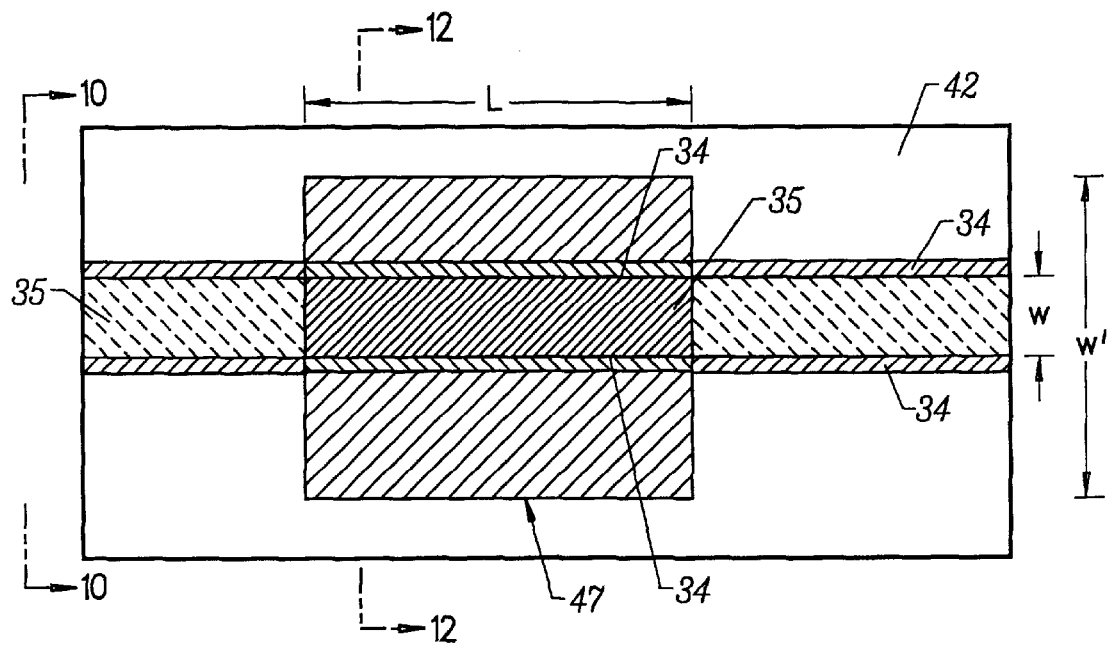
FIG. 9 is a top view of a second portion of the silicon wafer shown in FIG. 7 covered with an oxide layer, the oxide layer having a contact region formed therein.
Figure 10:
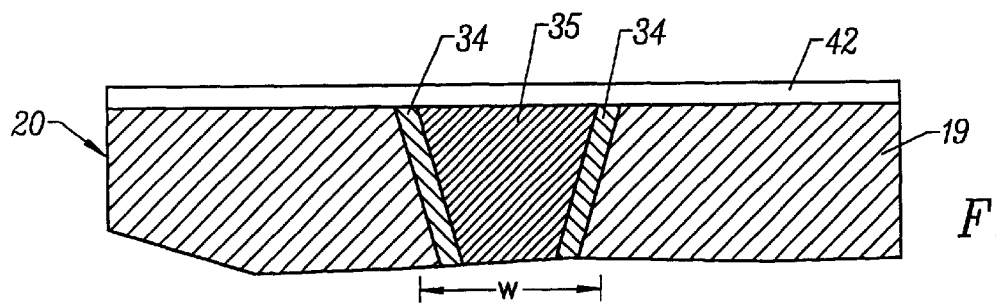
FIG. 10 is a cross section along line 7—7 of FIG. 8.

FIG. 9 illustrates a top view of a bonded wafer substrate assembly which may have any number of active regions, such as that shown in FIG. 4, formed therein. The bonded wafer substrate assembly includes a trench isolation structure having a cross-section similar to that shown in FIG. 7, in a region where no underlying p+ regions exist. It should be noted that the light shading appearing in FIG. 9 represents that an oxide layer 42 has been formed over the surface of a wafer 10. This is illustrated in FIG. 10, which is a partial cross-section of the wafer assembly along line 10—10 in FIG. 9. Handle wafer 15 is not shown in FIGS. 10–12 and 14 for the sake of simplicity. Oxide 42 may be a thermally grown oxide formed over the surface of wafer 10 and, in accordance with well-known processing techniques, patterned to allow conductive interconnects to the active circuit elements of the integrated circuit.

Trench 29 is formed to width W which is limited in a practical sense by the formative limits of the technology used to manufacture the integrated circuit. Currently, a typical fabrication dimension that may be formed on an analog integrated circuit is approximately 2 microns.

Figure 11:
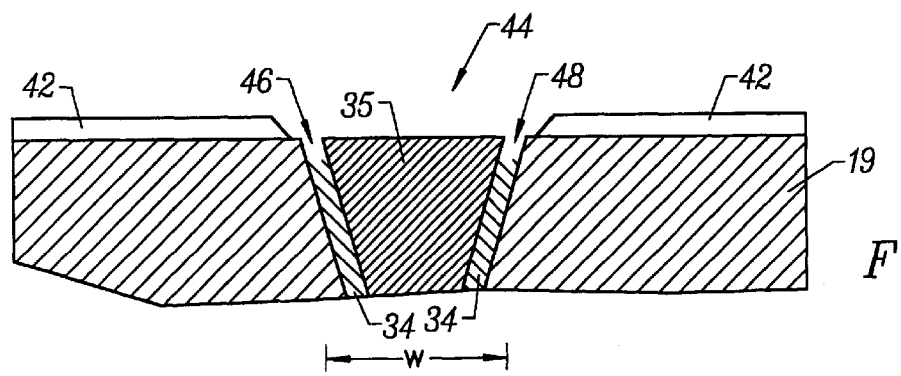
FIG. 11 illustrates a cross section similar to that shown in FIG. 7 wherein a contact area having conventional dimensions is shown.

A key feature of the present invention is the improvement in the isolation afforded by an isolation structure filled with polysilicon by electrically coupling the polysilicon to a charge control mechanism. FIG. 11 illustrates a contact opening made in the oxide layer 42 at a width equivalent to W, the width of the trench. The opening is made by a conventional selective oxide etch process preceded by application of a photoresist layer and masking of the resist layer to expose the areas to be etched. In one embodiment, W may be approximately 2 microns. A conventional contact opening has a square shape, as shown in FIG. 9, and thus has dimensions W×W.

As shown in FIG. 11, because the thermal oxide 42 etches at a slower rate than the TEOS oxide 34, the etch process utilized to remove the portion of oxide layer 42 defining the contact region will result in non-uniform etching of the respective oxide layers 42,34. As a result, portions 46,48 of the TEOS oxide 34, between polysilicon and substrate 10, are etched away, leaving a significant difference in the step distance between the oxide 42 and the surface of polysilicon 35. Regions 46,48, in turn, make it difficult to place a conductive contact material into a conventional small size opening 44 to contact polysilicon 35. This is due to the poor step coverage between the conductive material placed on the surface of oxide 42 and into region 47 to engage the surface of polysilicon 35.

Figure 6:
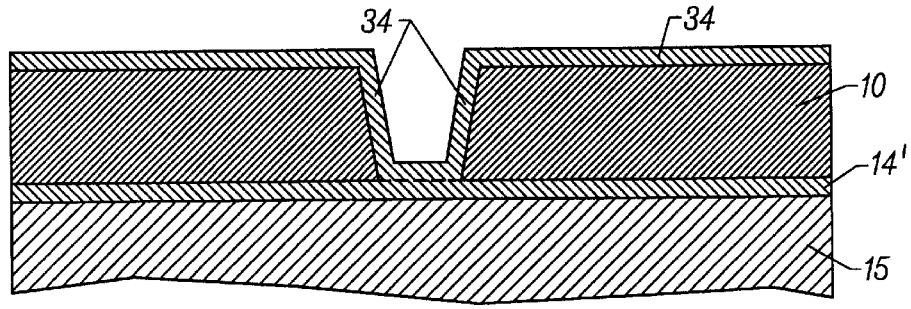
Figure 12:
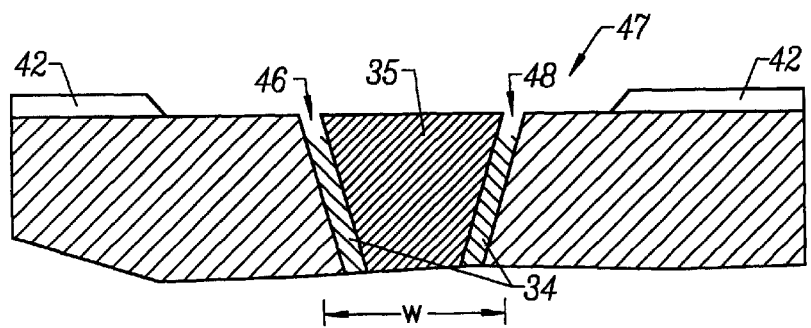
FIG. 12 is a cross section of a contact opening in the wafer structure shown in FIG. 9 along line 12—12.

In accordance with the present invention, a contact region 47 is provided which is significantly larger than the area to be contacted in a region absent p+ (or n+) diffused regions such that the width of the contact area is greater than that of the trench 35. As shown in FIG. 12, the contact area will have a width W' and a length L. In FIG. 6, W' is defined as approximately two times width W of the trench. Thus, if the trench is two microns, the width W' of contact opening 47 will be 4 microns. And, as is commonly the case, if W'=L, the contact opening 47 will have dimensions of 4 microns×4 microns as is illustrated in FIG. 9. Notably, the contact opening is made in an area where diffused P-type regions are not exposed to the contact region.

It should be recognized that the particular dimensions set forth herein are exemplary and the invention may be scaled for use with isolation structures of varying size. In general, the width W' of the contact opening, at a minimum, must be larger than the width W of the trench by an amount equal to or greater than the worst case misalignment of the etch process plus an etch tolerance. For example, if misalignment of the contact to the trench is 1 micron and the total etch bias is 1 micron, then the contact must be at least 2 microns larger than the trench on each side.

Figure 13:
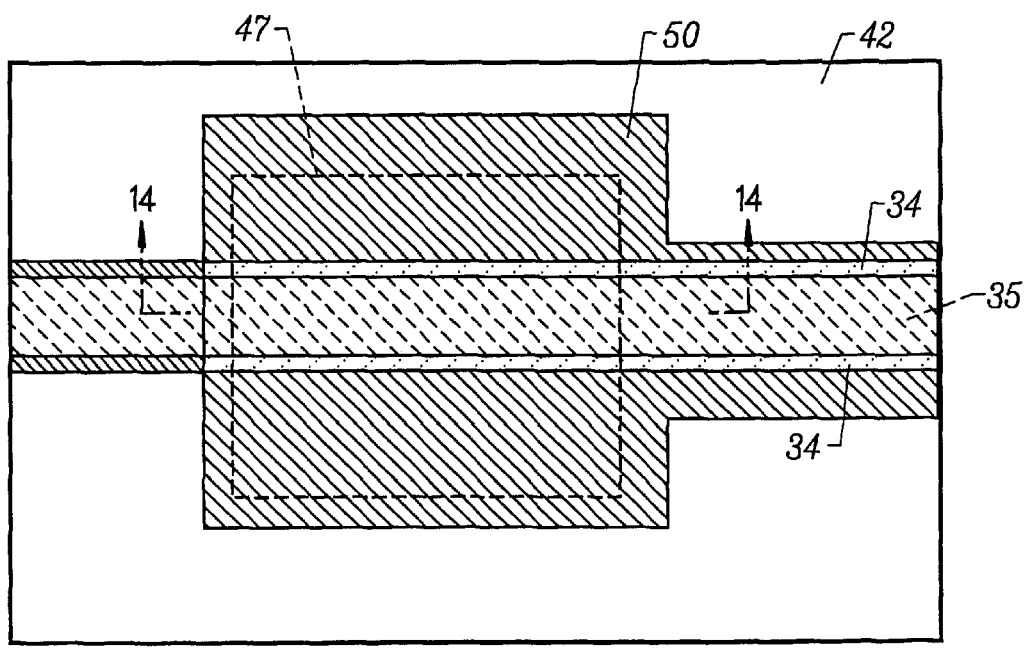
FIG. 13 is a top view of the second portion of the wafer shown in FIG. 9 having a conductive contact layer deposited thereon.
Figure 14:
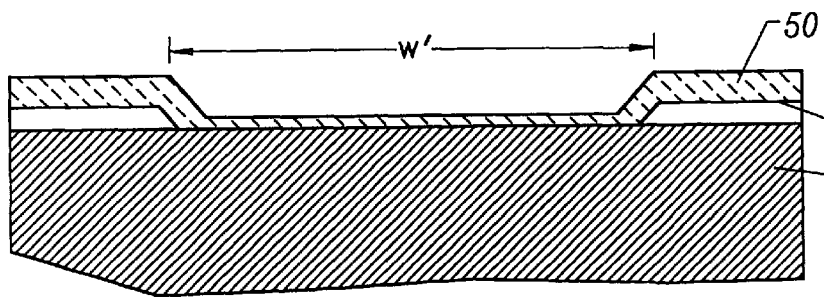
FIG. 14 is a cross section along line 14—14 of FIG. 13.

As shown in FIG. 13 and in cross section in FIG. 14, a contact layer 50 comprising a metal or metal silicide can then be formed on the surface of oxide 42. Because the area of the contact region 47 is extremely large, the contact layer 50 will have a normal step coverage along line 14—14 shown in FIGS. 13 and 14. The difference between the surface of layer 42 and polysilicon 35 is a normal step, allowing the metal to enter contact region 47 and ensure good contact to the polysilicon 35.

Once polysilicon 35 is coupled to a contact layer 50, the contact layer can be coupled to any number of charge dissipation devices. For example, the contact structure can be coupled to ground, or a selected positive or negative voltage sink.

As a result, the isolation structure of the present invention ensures that the polysilicon deposition in the trench isolation structure will not charge up and affect the active devices formed in substrate 10. Moreover, no separate masking step is required to form polysilicon to be coupled to polysilicon 35 in the trench. As should be noted, the particular contact structure will have broader applications in devices where trench isolation structures utilizing polysilicon fills are implemented, including silicon on insulator (SOI) technologies. The contact structure of the present invention is particularly useful in bonded wafer technology where the polysilicon is isolated from the balance of the device.

The many objects and advantages of the present invention will be obvious to one of average skill in the art. Many obvious modifications of the present invention will also be apparent to one of average skill. Such modifications are intended to be within the scope of the invention as defined by the instant specification and the following claims.

What is claimed is:

1. In a silicon-on-insulator integrated circuit having a plurality of active devices formed therein, a method of improving insulation between active devices using a trench isolation structure comprised of an insulating material and polysilicon, the trench isolation structure having a width, comprising:

forming an oxide layer over the surface of the silicon, the insulating material and the polysilicon;

forming a contact region by removing a portion of the oxide layer, said portion overlying a portion of the polysilicon of an area having a cross section greater than the width of the isolation structure; and coupling the isolation structure to a charge dissipation means by forming a conductive material on the surface of a portion of the oxide layer and on the surface of and connected to the polysilicon.

2. The method of claim 1 wherein said step of coupling comprises forming a contact structure having a first portion in contact with the polysilicon and a second portion coupled to the charge dissipation means.

3. The method of claim 1 wherein the silicon on insulator integrated circuit comprises a bonded wafer structure.

4. The method of claim 1 wherein said step of forming further comprises forming the contact region with a cross section equal to about two times the width of the isolation structure.

5. The method of claim 4 wherein said step of forming comprises forming the contact region having a square shape such that each side of the square has a length about equal to twice the width of the insulation structure.

6. The method of claim 1 wherein the step of forming the oxide layer comprises growing an oxide layer on the silicon.

7. The method of claim 6 wherein the step of coupling comprises depositing a layer of conductive material on the oxide layer such that a portion of the conductive material enters the contact region.

8. A method of forming an isolation structure in a silicon on insulator integrated circuit device, comprising:

forming a trench in the silicon, the silicon having a surface and the trench extending to a depth below the surface, the trench having a width;

forming an insulator layer in the trench;

forming a layer of polysilicon on the insulator layer in the trench;

forming an oxide layer over the surface of the silicon, the insulator layer and the polysilicon;

removing a portion of the oxide layer, said portion overlying a portion of the polysilicon and having an area with a cross-section greater than the width of the trench; and forming a conductive material on the surface of a portion of the field oxide and on the surface of the polysilicon coupling the polysilicon to a charge dissipation element.

9. The method of claim 8 wherein the step of forming comprises anisotropically etching a trench into the silicon.

10. The method of claim 8 wherein the step of forming an insulator layer in the trench comprises depositing a TEOS oxide on the surface of the silicon and in the trench.

11. The method of claim 10 wherein the step of depositing comprises depositing a TEOS oxide through a plasma enhanced chemical vapor deposition process.

12. The method of claim 8 wherein the step of forming the field oxide comprises heating the structure in an oxygen atmosphere.

13. The method of claim 8 wherein the step of removing comprises:

masking the surface of the oxide layer with a mask layer;

patterning the mask layer to expose the portion of the oxide layer to be removed; and etching the oxide layer.

14. The method of claim 13 wherein the portion of the oxide layer to be removed has said cross-section equal to twice the width of the trench.

15. The method of claim 8 wherein the portion has dimensions equal to two times the width of the trench by two times the width of the trench.

16. A method comprising:

(a) providing a first substrate of a first conductivity type having a top surface and a bottom surface;

(b) providing a second substrate of a second conductivity type having a top surface and a bottom surface;

(c) bonding the bottom surface of the first wafer to the top surface of the second wafer;

(d) forming a trench in the first wafer, the trench having at least a depth and a width;

(e) forming an insulating layer in the trench, the insulating layer lining the walls of the trench;

(f) depositing a polysilicon layer on the surface of the insulating layer, and planarizing the polysilicon layer down to the top surface of the first wafer;

(g) forming an oxide layer on the top surface of the first wafer;

(h) patterning the oxide layer;

(i) removing a portion of the oxide layer overlying a portion of the top surface, including a portion of the polysilicon and the insulating layer; and (j) forming a contact layer on the oxide and in said removed portion, the contact layer coupled to the polysilicon and a charge dissipation means.

17. The method of claim 16 further including the sub-step, prior to step (b), of:

forming a first impurity region in the first substrate, the first impurity region being of the second impurity type.

18. The method of claim 17 wherein said sub-step of forming comprises implanting an impurity in the top surface of the first wafer.

19. The method of claim 17 wherein said sub-step of forming comprises diffusing an impurity in the top surface of the first wafer.

20. The method of claim 16 wherein said step (c) comprises:

placing the top surface of the first substrate adjacent to the top surface of the second substrate; and heating the first and second substrates.

21. The method of claim 16 wherein said step (j) comprises depositing a conductive metal on the surface of the oxide layer and in the region in contact with the polysilicon.

22. The method of claim 16, wherein said step (j) comprises depositing a metal silicide on the surface of the oxide layer and in the region in contact with the polysilicon.

23. The method of claim 16 wherein said step (h) comprises:

depositing a photoresist layer;

patterning the photoresist layer.

24. The method of claim 23 wherein said step (i) comprises etching the oxide layer, and removing the photoresist layer.

25. In a bonded wafer structure, the structure having a first silicon wafer having a top surface and a bottom surface, the first wafer being bonded at its second surface to a second silicon wafer through the use of an oxide disposed between the first and the second wafers, the first wafer including a trench isolation structure, the structure including a trench having a width formed into the first wafer extending down a depth below the first surface of the wafer, a trench oxide layer disposed in the trench, and a silicon layer disposed on the oxide layer, the first wafer further including a mask layer overlying the first surface, a method for contacting said silicon layer comprising:

forming a contact area in the mask region by etching the mask region, the contact area exposing the first surface of the first wafer, a portion of the trench oxide, and a portion of the silicon, the contact area having a width of n times greater than the width of the trench; and depositing a contact layer over the layer, the contact layer having a width sufficient to fill the contact area and cover the surface of the mask layer, a portion of the contact layer being coupled to the silicon layer on the oxide layer.

26. The method of claim 25 wherein n is greater than one.

27. The method of claim 25 wherein n is two.

* * * * *